United States Patent
Hatano et al.

(10) Patent No.: US 11,239,380 B2
(45) Date of Patent: Feb. 1, 2022

(54) PHOTOELECTRIC CONVERSION DEVICE, SUBSTRATE, AND SYSTEM WITH SEMICONDUCTOR REGIONS

(71) Applicant: CANON KABUSHIKI KAISHA, Tokyo (JP)

(72) Inventors: Yuuichirou Hatano, Kamakura (JP); Takahiro Shirai, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/520,499

(22) Filed: Jul. 24, 2019

(65) Prior Publication Data

US 2020/0035845 A1 Jan. 30, 2020

(30) Foreign Application Priority Data

Jul. 26, 2018 (JP) .............................. JP2018-140709

(51) Int. Cl.
*H01L 31/0352* (2006.01)
*H04N 5/335* (2011.01)
*H01L 27/146* (2006.01)

(52) U.S. Cl.
CPC .... *H01L 31/0352* (2013.01); *H01L 27/14625* (2013.01); *H01L 27/14643* (2013.01); *H04N 5/335* (2013.01)

(58) Field of Classification Search
CPC .... H01L 31/02; H01L 31/107; H01L 31/0352
See application file for complete search history.

(56) References Cited

U.S. PATENT DOCUMENTS

| 7,554,141 | B2 | 6/2009 | Yamaguchi et al. |
| 8,120,686 | B2 | 2/2012 | Hatano et al. |
| 2011/0241149 | A1* | 10/2011 | Mazzillo ............... H01L 31/107 257/438 |

FOREIGN PATENT DOCUMENTS

JP 2006-286933 A 10/2006

\* cited by examiner

*Primary Examiner* — Suberr L Chi
(74) *Attorney, Agent, or Firm* — Venable LLP (57) ABSTRACT

Photoelectric conversion device includes semiconductor chip including first semiconductor region, second semiconductor region arranged on the first semiconductor region, and third semiconductor region arranged on the second semiconductor region. Chip end face of the semiconductor chip is formed by the first semiconductor region, the second semiconductor region and the third semiconductor region. The first semiconductor region is of first conductivity type and the second semiconductor region is of second conductivity type. The third semiconductor region includes photoelectric conversion region, readout circuit region, and peripheral region. The peripheral region includes isolation region and outer periphery region arranged between the chip end face and the isolation region. The isolation region is of the second conductivity type and the outer periphery region is of the first conductivity type.

19 Claims, 8 Drawing Sheets

PHOTOELECTRIC CONVERSION DEVICE, SUBSTRATE, AND SYSTEM WITH SEMICONDUCTOR REGIONS

BACKGROUND OF THE INVENTION

Field of the Invention

The present invention relates to a photoelectric conversion device, a substrate, and a system.

Description of the Related Art

Japanese Patent Laid-Open No. 2006-286933 discloses that when a p-n junction face appears at a cut face of a chip in an image sensor, it increases the possibility that the surface of the cut face will unwantedly become the cause of a leakage current, become a channel for the leakage current, or increase the leakage current. As a structure to solve such a problem, Japanese Patent Laid-Open No. 2006-286933 discloses (in paragraphs 0024, 0025, and the like) a structure in which the cut face is formed only by a p-type semiconductor layer, a p-type well, and a p-type semiconductor substrate so that a p-n junction face will not appear on the cut face.

The concept of the invention disclosed here in Japanese Patent Laid-Open No. 2006-286933 is a concept in which only a p-type semiconductor region is exposed on the cut face. Since arranging a TEG (test element group) on a dicing line portion means exposing both the p-type and the n-type semiconductor regions on the cut face, it may be said that this arrangement goes against the concept of the invention disclosed in Japanese Patent Laid-Open No. 2006-286933. However, if a TEG is formed on a chip region, it will not only reduce the number of chips (image sensors) that can be obtained from a single substrate, but also complicate the exposure process (for example, by requiring two reticles to be used in one lithography process or the like) and increase the cost.

SUMMARY OF THE INVENTION

The present invention provides a photoelectric conversion device that has a structure advantageous in arranging a TEG to a dicing line portion while suppressing a leakage current, which can be generated in a p-n junction of an end face of a semiconductor chip, from influencing a photoelectric conversion region.

One of aspects of the present invention provides a photoelectric conversion device that includes a semiconductor chip which includes a first semiconductor region, a second semiconductor region arranged on the first semiconductor region, and a third semiconductor region arranged on the second semiconductor region, a chip end face of the semiconductor chip being formed by the first semiconductor region, the second semiconductor region and the third semiconductor region, wherein the first semiconductor region is of a first conductivity type and the second semiconductor region is of a second conductivity type opposite to the first conductivity type, wherein the third semiconductor region includes a photoelectric conversion region, a readout circuit region, and a peripheral region arranged to surround the photoelectric conversion region and the readout circuit region, wherein the peripheral region includes an isolation region and an outer periphery region arranged between the chip end face and the isolation region, and wherein the isolation region is of the second conductivity type and the outer periphery region is of the first conductivity type.

Further features of the present invention will become apparent from the following description of exemplary embodiments with reference to the attached drawings.

DESCRIPTION OF THE EMBODIMENTS

Exemplary embodiments of the present invention will be described hereinafter with reference to the accompanying drawings.

Figure 1:
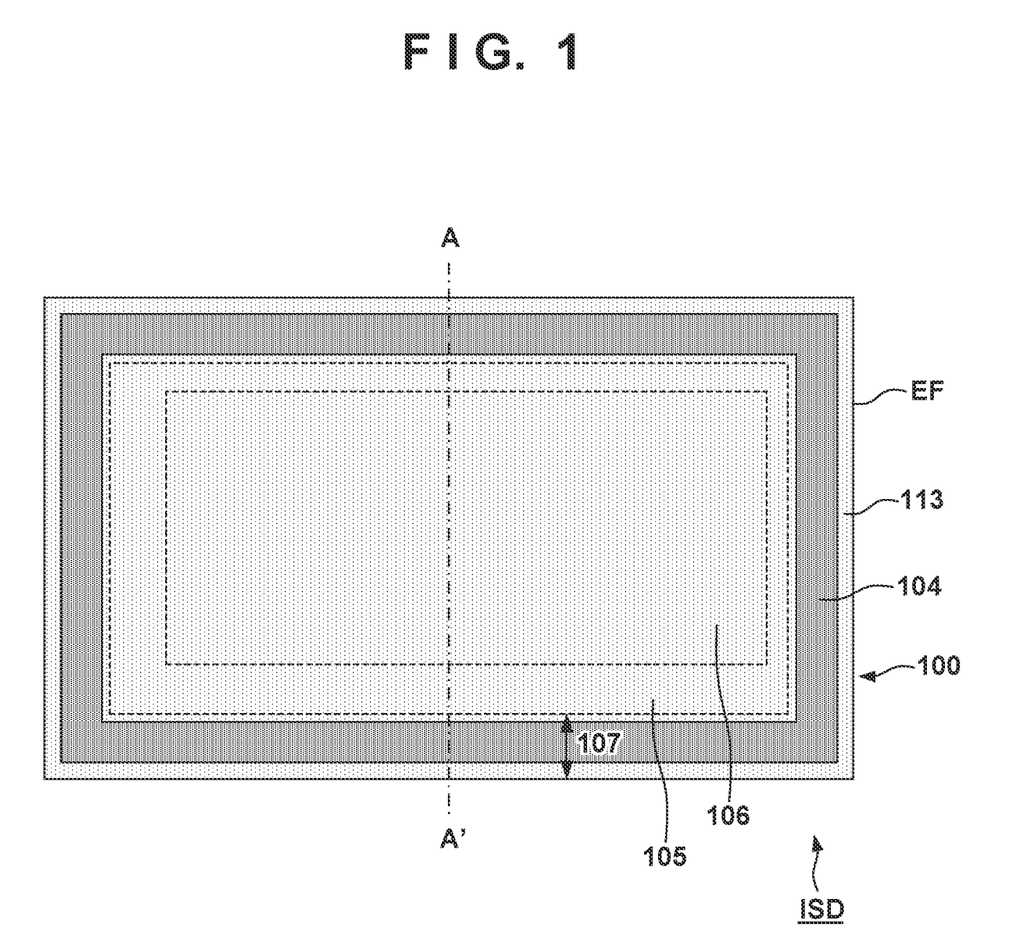
FIG. 1 is a plan view schematically showing the arrangement of an image sensor according to the first embodiment of the present invention.
Figure 2:
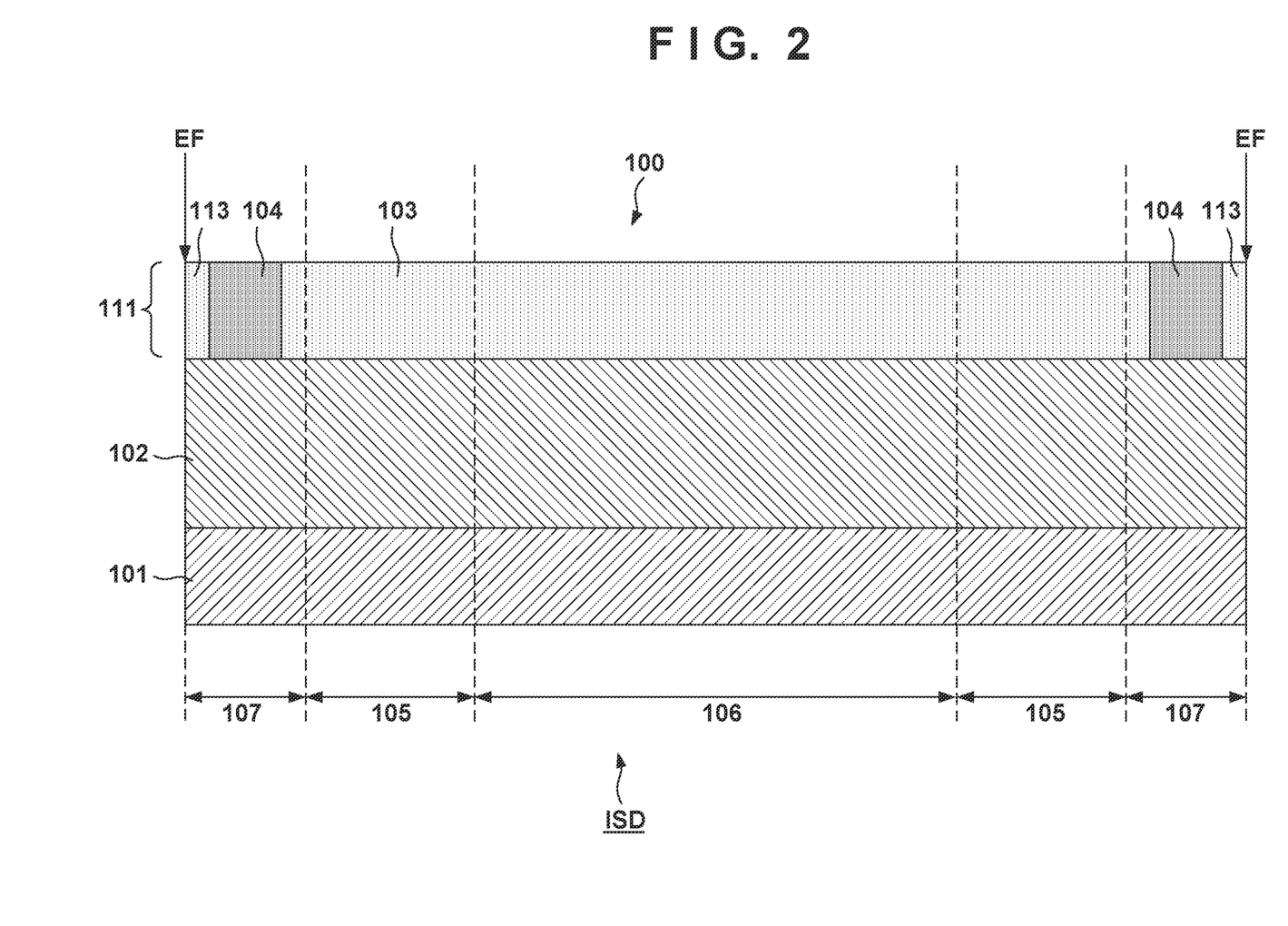
FIG. 2 is a view schematically showing a part of a sectional structure of the image sensor according to the first embodiment taken along a line A-A' of FIG. 1.

FIG. 1 schematically shows the arrangement of an image sensor ISD as an example of a photoelectric conversion device according to the first embodiment of the present invention. FIG. 2 schematically shows a part of a sectional structure of the image sensor ISD according to the first embodiment taken along a line A-A' of FIG. 1. The image sensor ISD can be formed as, for example, an image sensor such as a CMOS image sensor, a CCD image sensor, or the like. The image sensor ISD may be formed as a two-dimensional image sensor or a one-dimensional image sensor (line sensor). One of an n-type and a p-type will be referred to as "the first conductivity type", and the other of the n-type and the p-type will be referred to as "the second conductivity type", hereinafter. The second conductivity type is a conductivity type which is opposite of the first conductivity type. If the first conductivity type is the n-type, the second conductivity type will be the p-type. If the first conductivity type is the p-type, the second conductivity type will be the n-type. Note that the illustration of a structure which is to be arranged above the upper face of a third semiconductor region 111 has been omitted in FIG. 2. In addition, the illustration of elements such as photoelectric conversion elements, transistors, and the like which are formed using the third semiconductor region 111 has been omitted in FIG. 2.

The image sensor ISD includes a semiconductor chip 100. The semiconductor chip 100 includes a first semiconductor region 101, a second semiconductor region 102 arranged on the first semiconductor region 101, and the third semiconductor region 111 arranged on the second semiconductor region 102. An end face EF of the semiconductor chip 100 is a face that appears when a dicing process is performed to separate a plurality of the semiconductor chips 100 from a substrate on which the plurality of semiconductor chips 100 are arranged. The end face EF is formed by (the end face of) the first semiconductor region 101, (the end face of) the second semiconductor region 102, and (the end face of) third semiconductor region 111.

The first semiconductor region 101 is a region of a first conductivity type, and the second semiconductor region 102 is a region of a second conductivity type. The third semiconductor region 111 can include a photoelectric conversion region 106, a readout circuit region 105, and a peripheral region 107. The photoelectric conversion region 106 can include a region 103 which contains an impurity of the first conductivity type. The photoelectric conversion region 106 includes a plurality of photoelectric conversion elements (not shown) electrically isolated from each other. Each photoelectric conversion element can include a charge accumulation region that accumulates charges generated by photoelectric conversion. The readout circuit region 105 can include the region 103 which contains the impurity of the first conductivity type.

The readout circuit region 105 is a region in which a readout circuit is arranged for reading out signals from the plurality of photoelectric conversion elements arranged in the photoelectric conversion region 106. The readout circuit can include, for example, a row selection circuit that selects each row in a pixel array formed by the plurality of photoelectric conversion elements, a signal processing circuit that reads out the signals from the photoelectric conversion elements of the selected row, a column selection circuit that sequentially outputs the signals read out by the signal processing circuit, and the like. The peripheral region 107 is arranged so as to surround the photoelectric conversion region 106 and the readout circuit region 105.

The peripheral region 107 includes an isolation region 104 and an outer periphery region 113 arranged between the end face EF of the chip and the isolation region 104. The isolation region 104 is a region of the second conductivity type, and the outer periphery region 113 is a region of the first conductivity type. The distance between the upper face (the interface between the first semiconductor region 101 and the second semiconductor region 102 in this example) of the first semiconductor region 101 and the lower face of the isolation region 104 can be, for example, equal to or less than the thickness of the second semiconductor region 102.

The first semiconductor region 101 can be formed by, for example, a silicon substrate of the first conductivity type. The second semiconductor region 102 can be, for example, an epitaxial layer formed on the first semiconductor region 101 of the second conductivity type by using an epitaxial growth method. The third semiconductor region 111 includes, for example, a plurality of regions of the first conductivity type and a plurality of regions of the second conductivity type formed by performing ion implantation on the epitaxial layer (region 103) of the first conductivity type formed on the second semiconductor region 102 by using the epitaxial growth method. The photoelectric conversion elements or the like of the photoelectric conversion region 106 of the third semiconductor region 111 can be formed by, for example, performing ion implantation on the epitaxial layer (region 103) of the first conductivity type formed on the second semiconductor region 102 by using the epitaxial growth method. The readout circuit region 105 of the third semiconductor region 111 can be formed by performing ion implantation on the epitaxial layer (region 103) of the first conductivity type formed on the second semiconductor region 102 by using the epitaxial growth method. The isolation region 104 of the third semiconductor region 111 can be formed by, for example, performing ion implantation on the epitaxial layer (region 103) of the first conductivity type formed on the second semiconductor region 102 by using the epitaxial growth method. The outer periphery region 113 of the third semiconductor region 111 can be formed by, for example, a part of the epitaxial layer (region 103) of the first conductivity type itself formed on the second semiconductor region 102 by using the epitaxial growth method.

The junction between the second semiconductor region 102 of the second conductivity type and the outer periphery region 113 of the first conductivity type is exposed on the end face EF of the semiconductor chip 100. The junction of the second semiconductor region 102 and the outer periphery region 113 which is exposed on the end face EF can generate carriers. However, the influence on the reading circuit of the readout circuit region 105 and the photoelectric conversion elements of the photoelectric conversion region 106 from the carriers can be reduced by arranging the isolation region 104 of the second conductivity type in the peripheral region 107. Such a reduction effect can function effectively, for example, in a case in which the image sensor ISD is to accumulate charges for a long period time of 50 sec or more.

Note that the carriers can be generated in a portion where the p-n junction formed by the first semiconductor region 101 and the second semiconductor region 102 is exposed on the end face EF. However, the second semiconductor region 102 prevents the carriers from moving to the readout circuit of the readout circuit region 105 and the photoelectric conversion elements of the photoelectric conversion region 106.

When the image sensor ISD or the semiconductor chip 100 is to be diced from the substrate on which it is mounted on, a TEG arranged outside (that is, further left from the left-hand side of the end face EF or further right from the right hand side of the end face EF in FIG. 2) the end face EF can be removed. The TEG is formed on a dicing line portion (scribe line portion), which is to be removed by dicing, on the epitaxial layer (region 103). Hence, for example, in the epitaxial layer (region 103) of the dicing line portion, it is possible to form photoelectric conversion elements that have a structure identical to the photoelectric conversion elements of the photoelectric conversion region 106 or form a process TEG for confirming the validity of a process.

Figure 3:
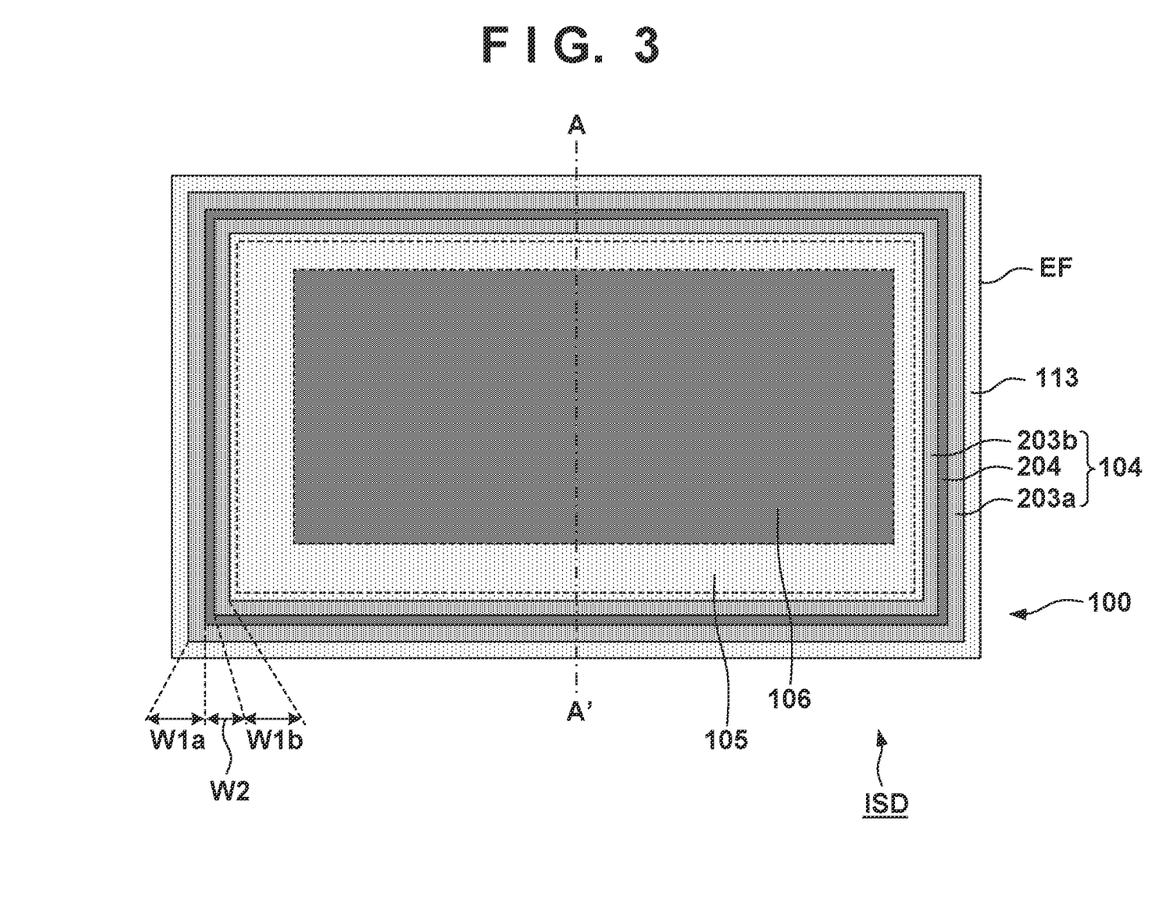
FIG. 3 is a plan view schematically showing the arrangement of an image sensor according to the second embodiment of the present invention.
Figure 4:
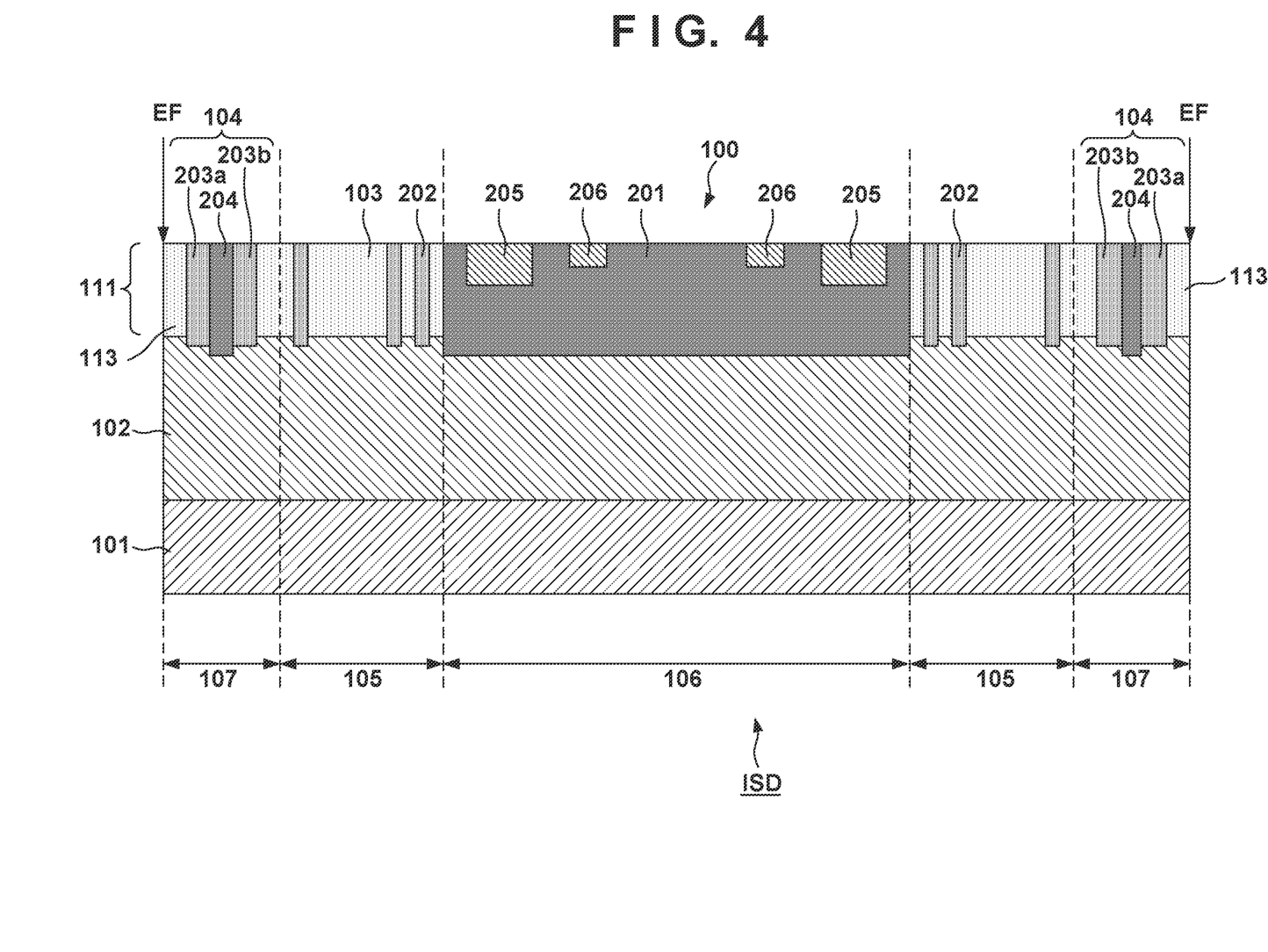
FIG. 4 is a view schematically showing a part of a sectional structure of the image sensor according to the second embodiment taken along a line A-A' of FIG. 3.

FIG. 3 schematically shows the arrangement of an image sensor ISD as an example of a photoelectric conversion device according to the second embodiment of the present invention. FIG. 4 schematically shows a part of the sectional structure of the image sensor ISD taken along a line A-A' of FIG. 3. Note that matters not mentioned in the second embodiment follow those described the first embodiment.

A photoelectric conversion region 106 can include first region 201 of the second conductivity type, a plurality of regions 205 of the first conductivity type, and a plurality of regions 206 of the first conductivity type. A readout circuit region 105 can include at least one region 103 of the first conductivity type and at least one second region 202 of the second conductivity type. An isolation region 104 of a peripheral region 107 can include third regions 203a and 203b of the second conductivity type and a fourth region 204 of the second conductivity type. Note that the illustration of a structure to be arranged above the upper face of a third semiconductor region 111 has been omitted in FIG. 4. In addition, the illustration of elements such as transistors and the like has been omitted in FIG. 4.

Each region 205 of the first conductivity type in the photoelectric conversion region 106 can form a photodiode (photoelectric conversion element) together with the first region 201 of the second conductivity type. In FIG. 4, the regions 206 of the first conductivity type in the photoelectric conversion region 106 are regions representing a floating diffusion and the source and drain regions of MOS transistors. A plurality of MOS transistors of the second conductivity type can be arranged in the region 103 of the first conductivity type in the readout circuit region 105. Circuit elements such as a plurality of MOS transistors of the first conductivity type can be arranged in the second region 202 of the second conductivity type in the readout circuit region 105. On the other hand, circuit elements such as the MOS transistors and the photoelectric conversion elements are not arranged in the isolation region 104 (the third regions 203a and 203b and the fourth region 204) of the peripheral region 107. The peripheral region 107 includes an outer periphery region 113 arranged between an end face EF of the chip and the isolation region 104.

In one example, each of the distances from the upper face of a first semiconductor region 101 to the lower face of the first region 201 and the lower face of the fourth region 204 is smaller than each of the distances from the upper face of the first semiconductor region 101 to the lower face of the second region 202 and the lower faces of the third regions 203 (203a and 203b). In other words, in one example, the depth from the surface of the third semiconductor region 111 as a reference to each of the lower face of the first region 201 and the lower face of the fourth region 204 is greater than the depth from the surface of the third semiconductor region 111 as a reference to each of the lower face of the second region 202 and the lower faces of the third regions 203. Unless otherwise mentioned, the depth will be described hereinafter as a depth from the surface of the third semiconductor region 111 as a reference.

In one example, the distance from the upper face of the first semiconductor region 101 to the lower face of the first region 201 is equal to the distance from the upper face of the first semiconductor region 101 to the lower face of the fourth region 204. In other words, the depth to the lower face of the first region 201 is equal to the depth to the lower face of the fourth region 204. Also, in one example, the maximum value of the impurity concentration of the second conductivity type in the first region 201 is equal to the maximum value of the impurity concentration of the second conductivity type in the fourth region 204. The first region 201 and the fourth region 204 can be formed by same processes (the same photolithography process and the same ion implantation process). This will contribute to the reduction in the number of processes. In this case, other than contributing to the reduction in the number of photomasks (reticles), forming the first region 201 and the fourth region 204 by the same process will contribute to ensuring the relative position of the fourth region 204 of the isolation region 104 with respect to the photoelectric conversion region 106. This is advantageous in stabilizing the characteristic of cutting off the movement of the carriers from the outer periphery region 113 to the photoelectric conversion region 106.

In one example, the distance from the upper face of the first semiconductor region 101 to the lower face of the second region 202 is equal to the distance from the upper face of the first semiconductor region 101 to the lower faces of the third regions 203. In other words, in one example, the depth to the lower face of the second region 202 is equal to the depth to the lower face of each third region 203. Also, in one example, the maximum value of the impurity concentration of the second conductivity type in the second region 202 is equal to the maximum value of the impurity concentration of the second conductivity type in each third region 203. The second region 202 and the third regions 203 can be formed by same processes (the same photolithography process and the same ion implantation process). The fourth region 204 can be arranged so as to isolate the third regions 203 into the outer region 203a and the inner region 203b.

In one example, the impurity concentration of the second conductivity type in the first region 201 and the impurity concentration of the second conductivity type in the fourth region 204 are lower than the impurity concentration of the second conductivity type in the second region 202 and the impurity concentration of the second conductivity type in each third region 203.

In the plan view (planar view) shown in FIG. 3, the third regions 203 (203a and 203b) and the fourth region 204 are arranged so as to surround the photoelectric conversion region 106 and the readout circuit region 105 from the outer side. In one example, a width W2 of the fourth region 204 is smaller than each of a width W1a of the outer region 203a and a width W1b of the inner region 203b in a direction parallel to the upper face of the first semiconductor region 101.

Figure 5:
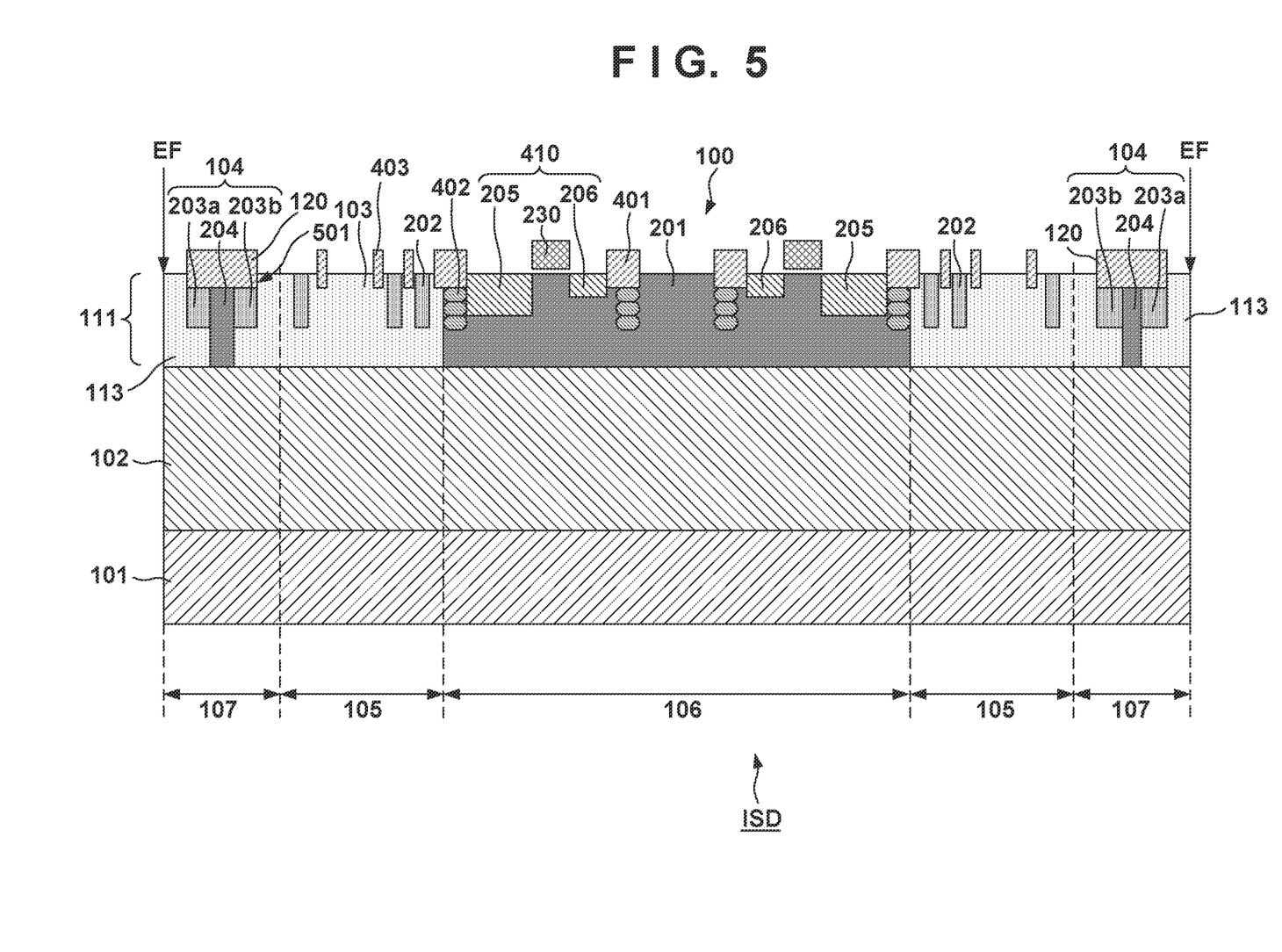
FIG. 5 is a view schematically showing a part of a sectional structure of an image sensor according to the third embodiment taken along a line A-A' of FIG. 3.

FIG. 5 schematically shows a part of the sectional structure of an image sensor ISD as an example of a photoelectric conversion device according to the third embodiment of the present invention. The sectional structure shown in FIG. 5 here corresponds to the sectional structure taken along a line A-A' of FIG. 3. Note that matters not mentioned in the third embodiment can follow those described in the first and second embodiments. Element isolation portions 401 are arranged in a photoelectric conversion region 106, and element isolation portions 403 are arranged in a readout circuit region 105. The element isolation portions 401 and 403 can be formed by, for example, LOCOS (local oxidation of silicon) or STI (shallow trench isolation). Note that in FIG. 5, the illustration has been omitted, with the exception of some parts, for a structure to be arranged above the upper surface of a third semiconductor region 111 and elements such as transistors and the like.

The photoelectric conversion region 106 can include a first region 201 of the second conductivity type, a plurality of regions 205 of the first conductivity type, a plurality of regions 206 of the first conductivity type, and a plurality of gate electrodes 230 each arranged above the region between the region 205 and the region 206. The readout circuit region 105 can include at least one region 103 of the first conductivity type and at least one second region 202 of the second conductivity type. The photoelectric conversion region 106 includes a plurality of pixels 410, and each pixel 410 can include one charge accumulation region formed by the corresponding one of the regions 205 of the first conductivity type. Other than the element isolation portions 401, the pixel 410 and the pixel 410 can be isolated by a region 402 of the second conductivity type arranged below each element isolation portion 401. In one example, the maximum value of the impurity concentration of the second conductivity type in each region 402 is greater than the maximum value of the impurity concentration of the second conductivity type in the first region 201 by about one to two orders of magnitude. Each region 402 can be formed by a structure obtained by stacking a plurality of regions of the second conductivity type. The plurality of regions can be formed so as to have a higher impurity concentration of the second conductivity type the closer the region is to the surface of the third semiconductor region 111.

An isolation region 104 of the peripheral region 107 can include the third regions 203a and 203b of the second conductivity type and a fourth region 204 of the second conductivity type. A plurality of MOS transistors of the second conductivity type can be arranged in the region 103 of the first conductivity type in the readout circuit region 105. A plurality of MOS transistors of the first conductivity type can be arranged in the second region 202 of the second conductivity type in the readout circuit region 105. On the other hand, elements such as the MOS transistors, the photoelectric conversion elements, and the like are not arranged in the isolation region 104 (the third regions 203a and 203b and the fourth region 204) of the peripheral region 107. The peripheral region 107 includes an outer periphery region 113 arranged between an end face EF of the chip and the isolation region 104.

The first region 201 and the fourth region 204 can be arranged so as to be in contact with the upper surface of a second semiconductor region 102. In one example, each of the distances from the upper face of a first semiconductor region 101 to the lower face of the first region 201 and the lower face of the fourth region 204 is shorter than each of the distances from the upper face of the first semiconductor region 101 to the lower face of the second region 202 and from that to the lower faces of the third regions 203 (203a and 203b). In other words, in one example, the depth to each of the lower face of the first region 201 and the lower face of the fourth region 204 is greater than the depth to each of the lower face of the second region 202 and the lower faces of the third regions 203. Alternatively, a part of a region 103 can be arranged between the lower face of the second region 202 and the upper face of the second semiconductor region 102. Alternatively, the lower face of the second region 202 is separated from the upper face of the second semiconductor region 102.

In one example, the depth to the lower face of the first region 201 and the lower face of the fourth region 204 is within the range of 4 to 6 μm, for example, 5 μm, and the depth to the lower face of the second region 202 and the lower face of the third regions 203 is within a range of 0.5 to 1.5 μm, for example, 1 μm. In one example, the impurity concentration of the second conductivity type of the first region 201 and the fourth region 204 becomes higher the closer they are to the upper face of the third semiconductor region 111. For example, the impurity concentration of the second conductivity type of the first region 201 and the fourth region 204 can fall within the range of $1\times10^{15}$ to $1\times10^{16}$ cm$^{-3}$ near the lower face of the third semiconductor region 111. Also, the impurity concentration of the second conductivity type of the first region 201 and the fourth region 204 can fall within the range of $1\times10^{19}$ to $1\times10^{20}$ cm$^{-3}$ at a depth of about 0.2 μm from the surface of the third semiconductor region 111.

In one example, at the same depth, the impurity concentration of the second conductivity type of the first region 201 and the fourth region 204 is lower than the impurity concentration of the second conductivity type of the second region 202 and the third regions 203. For example, the impurity concentration of the second conductivity type of each third region 203 can fall within the range of $1\times10^{17}$ to $1\times10^{18}$ cm$^{-3}$ at a depth of about 1 μm.

The upper face of the peripheral region 107 (the third semiconductor region 111 of the peripheral region 107) can include a recess 501. The isolation region 104 arranged in the peripheral region 107 can be formed so as to include the third regions 203 (203a and 203b) of the second conductivity type and the fourth region 204 of the second conductivity type below the bottom face of the recess 501. An insulator 120 can be arranged in the recess 501. The insulator 120 can be formed simultaneously with the element isolation portions 401 and 403. The fourth region 204 can be arranged so as to separate the third regions 203 into the outer region 203a and the inner region 203b below the recess 501. The third regions 203 (203a and 203b) and the fourth region 204 are arranged so as to be in contact with the bottom face of the recess 501.

The third regions 203 (203a and 203b) and the fourth region 204 can be formed by performing ion implantation on the third semiconductor region 111. The surface of the third semiconductor region 111 can become damaged by the ion implantation. However, by arranging the insulator 120 in the recess 501 and arranging the third regions 203 (203a and 203b) and the fourth region 204 below this arrangement, it is possible to prevent noise from increasing when charge accumulation is to be performed over a long period of time.

By arranging the isolation region 104 of the second conductivity type in the peripheral region 107 as well in the third embodiment, the influence from the carriers to the readout circuit of the readout circuit region 105 and the photoelectric conversion elements of the photoelectric conversion region 106 can be reduced or cut off.

Figure 6:
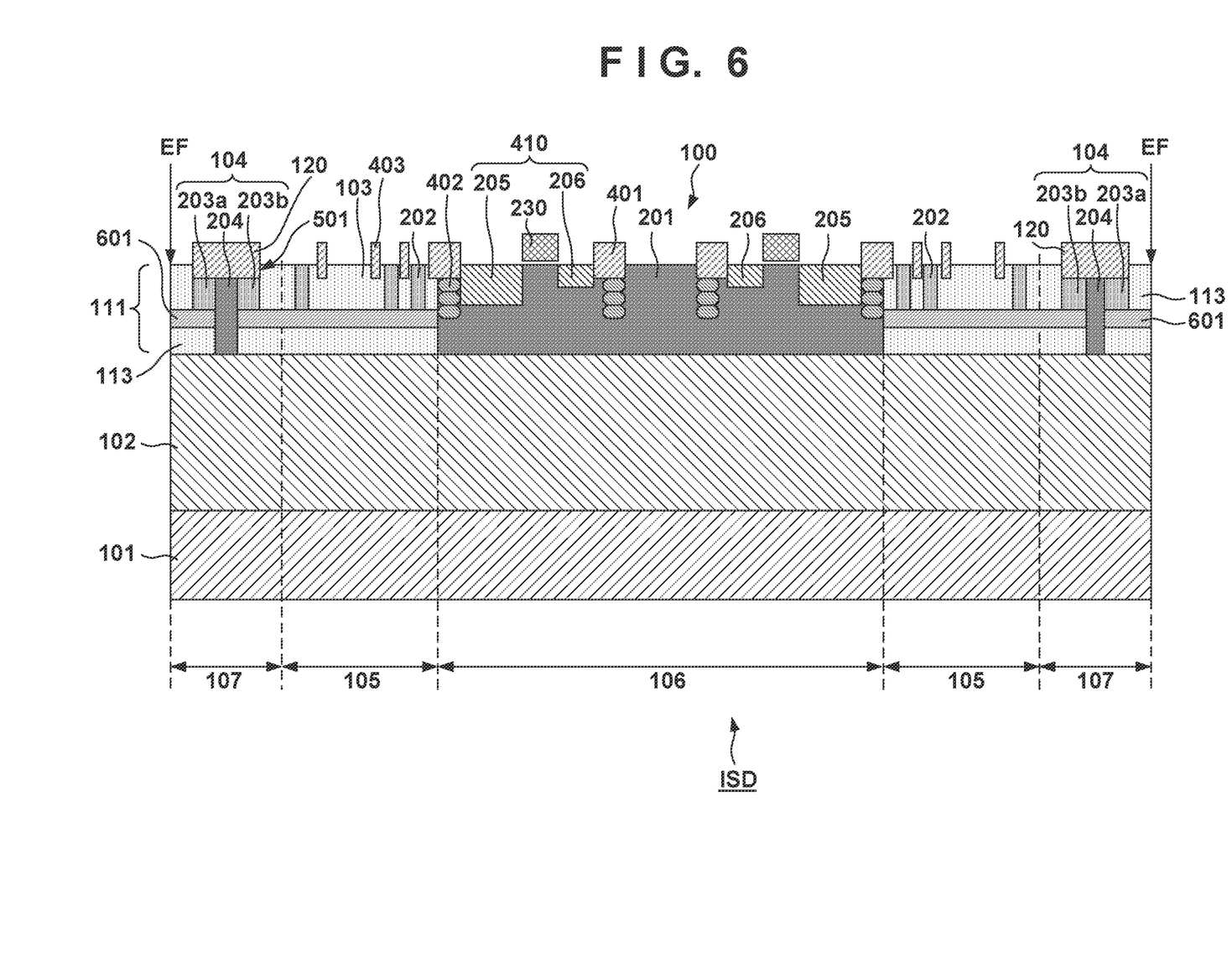
FIG. 6 is a view schematically showing a part of a sectional structure of an image sensor according to the fourth embodiment taken along a line A-A' of FIG. 3.

FIG. 6 schematically shows a part of the sectional structure of an image sensor ISD as an example of a photoelectric conversion device according to the fourth embodiment of the present invention. The image sensor ISD according to the fourth embodiment is a modification of an image sensor ISD according to the third embodiment shown in FIG. 5. Matters not mentioned in the fourth embodiment can follow those described in the third embodiment.

A readout circuit region 105 includes a region 103 of the first conductivity type and a second region 202 of the second conductivity type. A peripheral region 107 includes an isolation region 104, and the isolation region 104 can include third regions 203 (203a and 203b) of the second conductivity type and a fourth region 204 of the second conductivity type. The readout circuit region 105 and the peripheral region 107 include a fifth region 601 of the first conductivity type extending in parallel to the upper face of the second semiconductor region 102 so as to be in contact with the lower face of the second region 202 and the lower faces of the third regions 203. The depth of a portion which has the maximum concentration of a first impurity in the fifth region 601 is within a range of 1.5 to 2.5 μm, for example, 2 μm. The concentration of the first impurity in the fifth region 601 can fall within a range of $1\times10^{16}$ to $1\times10^{17}$ cm$^{-3}$.

The arrangement described above is advantageous in suppressing carriers generated at an end face EF of a semiconductor chip 100 from entering a photoelectric conversion region 106 and suppressing leakage between the second region 202/third regions 203 and a second semiconductor region 102 to prevent occurrence of a dielectric breakdown.

An example in which the first conductivity type is set as the n-type and the second conductivity type is set as the p-type in the image sensor ISD according to the first to fourth embodiments described above will be described here. An first semiconductor region 101 can be formed by an n$^+$-type silicon substrate, the second semiconductor region 102 can be formed as a p-type epitaxial layer on the first semiconductor region 101, and a p-type epitaxial layer can be further formed as a third semiconductor region 111 on the second semiconductor region 102. Subsequently, a plurality of electron-collecting photoelectric conversion elements can be formed in the photoelectric conversion region 106 of the p-type epitaxial layer as the third semiconductor region 111.

Figure 7:
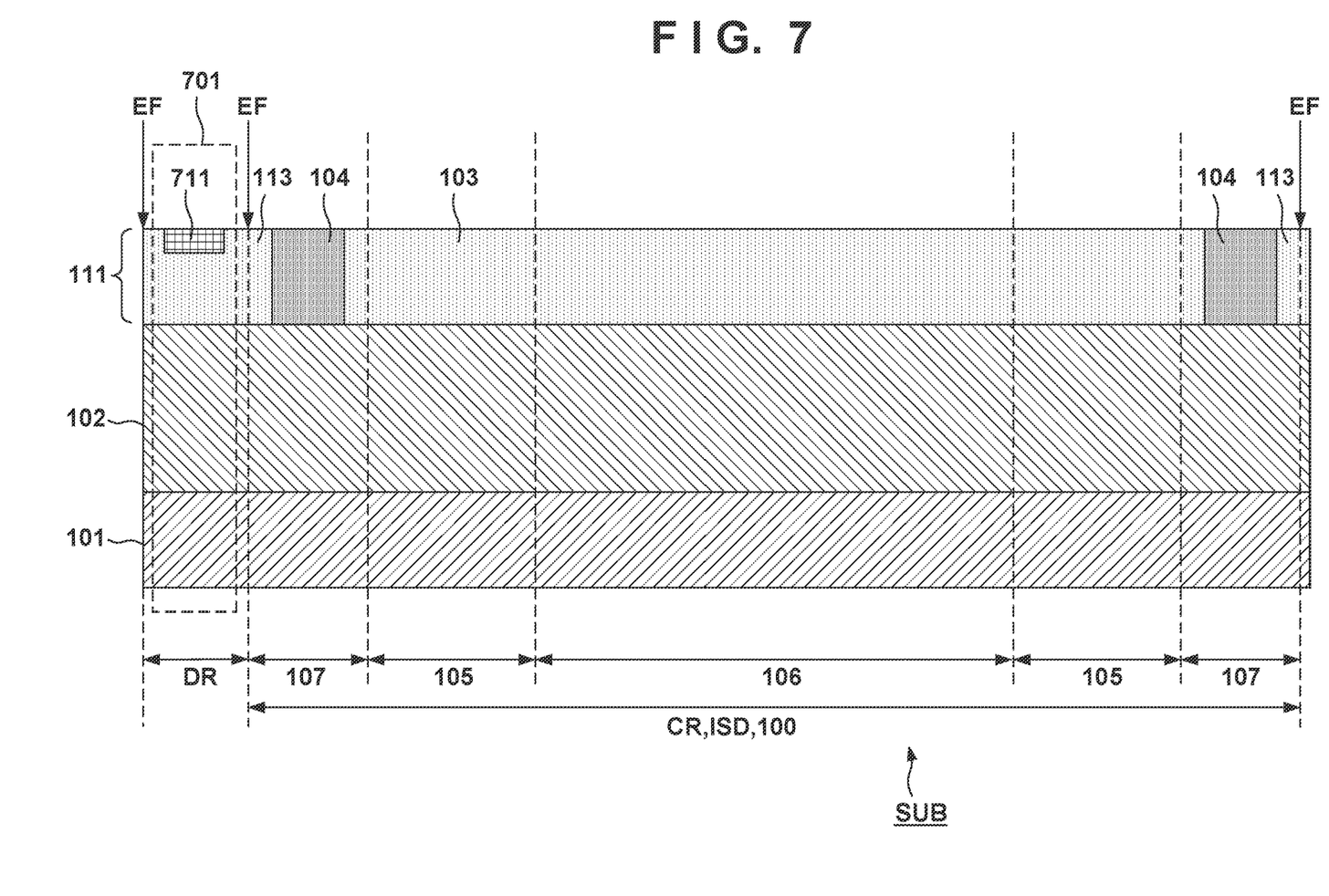
FIG. 7 is a view schematically showing a part of a schematic sectional structure of a substrate according to the fifth embodiment of the present invention.

FIG. 7 shows the schematic sectional structure of a substrate SUB according to the fifth embodiment of the present invention. The substrate SUB includes a region in which a plurality of semiconductor chip regions CR (ISD) are arranged. The substrate SUB includes a TEG 711 arranged in a dicing line region (scribe line region) between the plurality of semiconductor chip regions CR (only one semiconductor chip region CR is shown in FIG. 7). In a state in which the semiconductor chip regions have been diced from the substrate SUB, each of the plurality of semiconductor chip regions CR includes a circuit arrangement which is to be the image sensor ISD (semiconductor chip 100). The TEG 711 is arranged between an end face EF of one semiconductor chip region CR among the plurality of semiconductor chip regions CR and the end face EF of another semiconductor chip region CR among the plurality of semiconductor chip regions CR. The dicing line region (scribe line region) is a region for dicing the substrate SUB, that is, a region which is to be removed by dicing.

The TEG 711 can include, for example, elements similar to elements such as the photoelectric conversion elements arranged in a photoelectric conversion region 106 and elements such as the MOS transistors arranged in a readout circuit region 105. Alternatively, the TEG 711 can include a process TEG for confirming the validity of a process. The TEG 711 can be formed in a region 103 of the first conductivity type. Hence, in the region 103 of the first conductivity type in the dicing line portion 701, it is possible to form, for example, the photoelectric conversion elements that have an identical structure to the photoelectric conversion elements of the photoelectric conversion region 106 and form the process TEG for confirming the validity of a process.

In the embodiment described above, an interlayer insulating film including a wiring layer, a color filter layer, a microlens array, and the like are arranged on a third semiconductor region 111. As a result, a front-side illumination image sensor can be formed. However, note that the present invention can also be applied to a back-side illumination image sensor.

The image sensor ISD described above can be incorporated in various kinds of image sensing systems. Examples of such image sensing systems are a digital still camera, a digital camcorder, a surveillance camera, a copy machine, a facsimile machine, a cell phone, an onboard camera, and an observation satellite. The image sensing systems also include a camera module that includes the image sensor and an optical system such as a lens.

Figure 8:
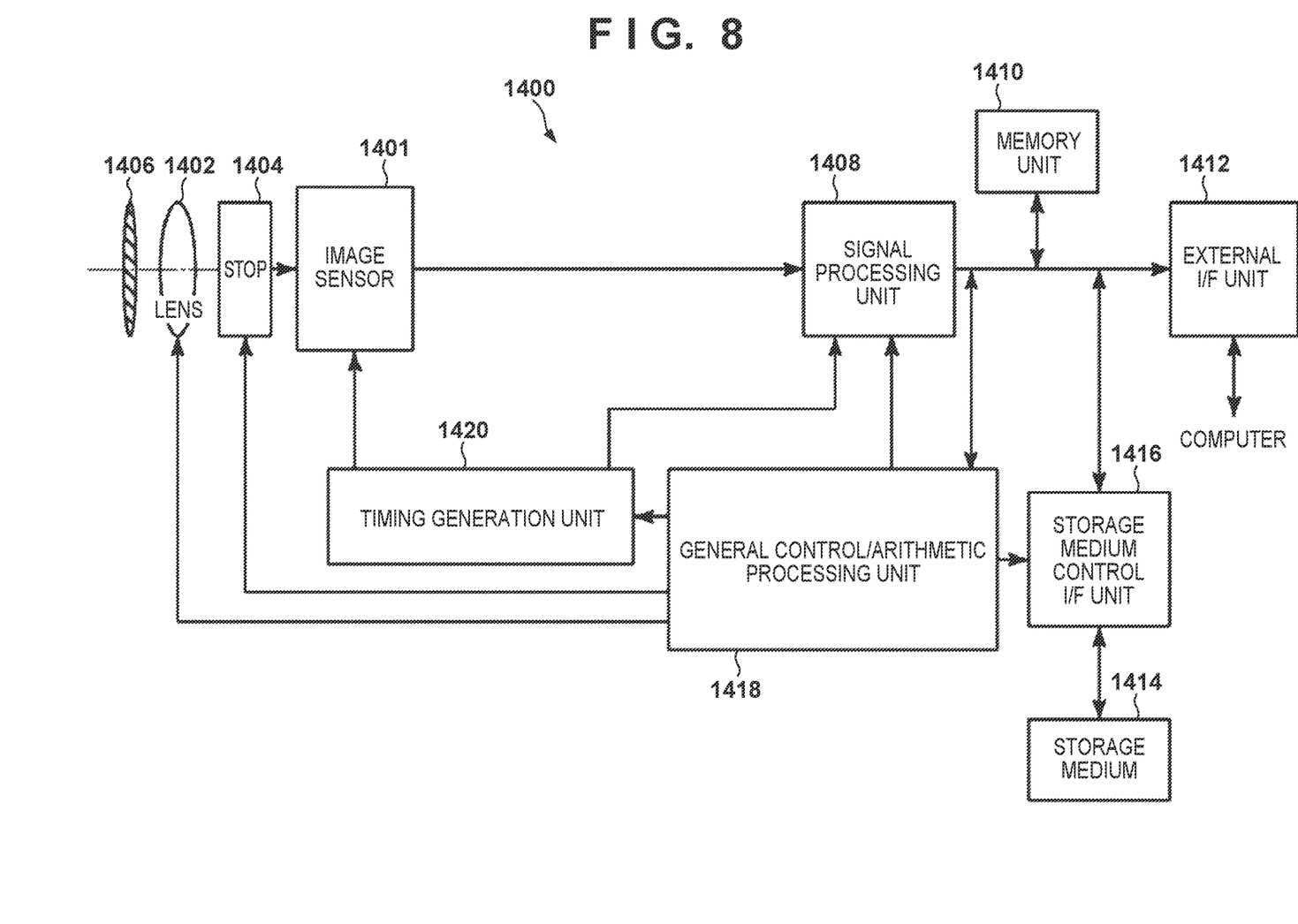
FIG. 8 is a block diagram showing an example of an image sensing system in which an image sensor according to one embodiment of the present invention is incorporated.

FIG. 8 shows an example of an image sensing system incorporating the image sensor ISD described above. In the example shown in FIG. 8, the image sensing system has been implemented as a digital still camera. An image sensing system 1400 exemplified in FIG. 8 includes an image sensor 1401 as the image sensor ISD described above and a lens 1402 for forming an optical image of an object on the image sensor 1401. The image sensing system also includes a stop 1404 for changing the amount of light that is passed through the lens 1402 and a barrier 1406 for protecting the lens 1402. The lens 1402 and the stop 1404 form an optical system for focusing light to the image sensor 1401. The image sensor 1401 is the image sensor ISD described in the first embodiment or the second embodiment, and converts an optical image formed by the lens 1402 into image data.

The image sensing system 1400 also includes a signal processing unit 1408 that performs processing of output signals output from the image sensor 1401. The signal processing unit 1408 performs A/D conversion to convert the analog signals output by the image sensor 1401 into digital signals. In addition, the signal processing unit 1408 also performs operations to output the image data after performing various kinds of correction and compression as needed. The A/D conversion unit which is a part of the signal processing unit 1408 can be formed on the semiconductor substrate on which the image sensor 1401 is arranged or may be formed on semiconductor substrate separately from that of the image sensor 1401. In addition, the image sensor 1401 and the signal processing unit 1408 may be formed on the same semiconductor substrate.

The image sensing system 1400 further includes a memory unit 1410 for temporarily storing the image data and an external interface unit (external I/F unit) 1412 for communicating with an external computer or the like. In addition, the image sensing system 1400 includes a storage medium 1414 such as a semiconductor memory or the like for storing or reading out the image sensing data and a storage medium control interface unit (storage medium control I/F unit) 1416 for storing or reading out the image sensing data to or from the storage medium 1414. Note that the storage medium 1414 may be incorporated in or detachable from the image sensing system 1400.

Furthermore, the image sensing system 1400 includes a general control/arithmetic processing unit 1418 for performing various kinds of arithmetic processing and for controlling the digital still camera overall and a timing generation unit 1420 that outputs various kinds of timing signals to the image sensor 1401 and the signal processing unit 1408. Note that the timing signal or the like may be input from the outside in this case, and it is sufficient for the image sensing system 1400 to include at least the image sensor 1401 and the signal processing unit 1408 that processes the signals output from the image sensor 1401.

The image sensor 1401 outputs image sensing signals to the signal processing unit 1408. The signal processing unit 1408 outputs image data by performing predetermined signal processing on each image sensing signal output from the image sensor 1401. The signal processing unit 1408 uses the image signals to perform an image forming operation. For example, the signal processing unit 1408 performs focus detection by using digital signals based on a noise signal, a first pixel signal, and a second pixel signal of the image sensor 1401. The image forming operation is also performed by using a digital signal based on the noise signal and the second pixel signal or the fourth pixel signal of the image sensor 1401.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-140709, filed Jul. 26, 2018, which is hereby incorporated by reference herein in its entirety.

What is claimed is:

1. A photoelectric conversion device that includes a semiconductor chip which includes a first semiconductor region, a second semiconductor region arranged on the first semiconductor region, and a third semiconductor region arranged on the second semiconductor region, a chip end face of the semiconductor chip being formed by the first semiconductor region, the second semiconductor region and the third semiconductor region,
  wherein the first semiconductor region is of a first conductivity type and the second semiconductor region is of a second conductivity type opposite to the first conductivity type,
  wherein the third semiconductor region includes a photoelectric conversion region, a readout circuit region, and a peripheral region arranged to surround the photoelectric conversion region and the readout circuit region,
  wherein the peripheral region includes an isolation region and an outer periphery region arranged between the chip end face and the isolation region, and
  wherein the isolation region is of the second conductivity type and the outer periphery region is of the first conductivity type.

2. The device according to claim 1, wherein a distance between an upper face of the first semiconductor region and a lower face of the isolation region is not more than a thickness of the second semiconductor region.

3. The device according to claim 1, wherein a distance an upper face of the first semiconductor region and a lower face of the isolation region is smaller than a thickness of the second semiconductor region.

4. The device according to claim 1, wherein the photoelectric conversion region includes a region of the first conductivity type and a first region of the second conductivity type,
  wherein the readout circuit region includes a region of the first conductivity type and a second region of the second conductivity type,
  wherein the isolation region includes a third region of the second conductivity type and a fourth region of the second conductivity type, and
  wherein each of distances from an upper face of the first semiconductor region to a lower face of the first region and from the upper face of the first semiconductor region to a lower face of the fourth region is shorter than each of distances from the upper face of the first semiconductor region to a lower face of the second region and from the upper face of the first semiconductor region to the lower face of the third region.

5. The device according to claim 4, wherein the distance from the upper face of the first semiconductor region to the lower face of the first region is equal to the distance from the upper face of the first semiconductor region to the lower face of the fourth region.

6. The device according to claim 4, wherein the distance from the upper face of the first semiconductor region to the lower face of the second region is equal to the distance from the upper face of the first semiconductor region to the lower face of the third region.

7. The device according to claim 4, wherein the fourth region is arranged to separate the third region into an outer region and an inner region.

8. The device according to claim 7, wherein a width of the fourth region is smaller than each of a width of the outer region and a width of the inner region in a direction parallel to the upper face of the first semiconductor region.

9. The device according to claim 1, wherein an upper face of the peripheral region includes a recess,
  wherein the isolation region includes a third region of the second conductivity type and a fourth region of the second conductivity type arranged below a bottom face of the recess, and
  wherein an insulator is arranged in the recess.

10. The device according to claim 9, wherein the fourth region is arranged so as to separate the third region into an outer region and an inner region.

11. The device according to claim 10, wherein a distance from an upper face of the first semiconductor region to a lower face of the fourth region is smaller than a distance from the upper face of the first semiconductor region to a lower face of the third region.

12. The device according to claim 9, wherein the third region and the fourth region are in contact with the bottom face of the recess.

13. The device according to claim 9, wherein the readout circuit region includes a region of the first conductivity type and a second region of the second conductivity type,
  wherein a lower face of the second region is separated from an upper face of the second semiconductor region,
  wherein a circuit element is arranged in the second region, and
  wherein the circuit element is not arranged in the third region and the fourth region.

14. The device according to claim 13, wherein a distance from the upper face of the first semiconductor region to the lower face of the second region is equal to a distance from the upper face of the first semiconductor region to a lower face of the third region.

15. The device according to claim 1, wherein the readout circuit region includes a region of the first conductivity type and a second region of the second conductivity type,
  wherein the isolation region includes a third region of the second conductivity type and a fourth region of the second conductivity type, and
  wherein the readout circuit region and the peripheral region include a fifth region of the first conductivity type which extends parallel to an upper face of the second semiconductor region so as to be in contact with a lower face of the second region and a lower face of the third region.

16. The device according to claim 15, wherein a distance between an upper face of the first semiconductor region and a lower face of the fourth region is not more than a thickness of the second semiconductor region.

17. The device according to claim 1, wherein a charge accumulation region of the first conductivity type is arranged in the photoelectric conversion region.

18. A substrate including a region on which a plurality of semiconductor chip regions are arranged, comprising:
  a TEG arranged in a dicing line region between the plurality of semiconductor chip regions,
  wherein in a state in which the plurality of semiconductor chip regions have been diced from the substrate, each of the plurality of semiconductor chip regions includes a photoelectric conversion device defined in claim 1, and
  the TEG is arranged between an end face of one semiconductor chip of the plurality of semiconductor chip regions and an end face of another semiconductor chip of the plurality of semiconductor chip regions.

19. A system comprising:
  a photoelectric conversion device defined in claim 1; and
  a processing unit configured to process a signal output from the photoelectric conversion device.

* * * * *